(12) United States Patent
Wegelin et al.

(10) Patent No.: US 10,903,408 B2
(45) Date of Patent: Jan. 26, 2021

(54) THERMAL ENERGY HARVESTING FOR DISPENSING SYSTEM

(71) Applicant: GOJO Industries, Inc., Akron, OH (US)

(72) Inventors: Jackson William Wegelin, Stow, OH (US); Demetrius Henry, Stow, OH (US); Nick Ermanno Ciavarella, Seven Hills, OH (US)

(73) Assignee: GOJO INDUSTRIES, INC., Akron, OH (US)

( * ) Notice: Subject to any disclaimer, the term of this patent is extended or adjusted under 35 U.S.C. 154(b) by 0 days.

(21) Appl. No.: 16/436,187

(22) Filed: Jun. 10, 2019

(65) Prior Publication Data

US 2019/0296205 A1    Sep. 26, 2019

Related U.S. Application Data

(60) Continuation of application No. 15/069,201, filed on Mar. 14, 2016, now Pat. No. 10,319,895, which is a division of application No. 13/770,440, filed on Feb. 19, 2013, now Pat. No. 9,287,734.

(51) Int. Cl.
*H01L 35/28*  (2006.01)
*H02J 7/34*   (2006.01)
*A47K 5/12*   (2006.01)
*H01L 35/32*  (2006.01)

(52) U.S. Cl.
CPC ............... *H01L 35/28* (2013.01); *A47K 5/12* (2013.01); *A47K 5/1217* (2013.01); *H01L 35/32* (2013.01); *H02J 7/34* (2013.01); *H02J 7/345* (2013.01)

(58) Field of Classification Search
USPC ........................................................ 320/101
See application file for complete search history.

(56) References Cited

U.S. PATENT DOCUMENTS

| | | | |
|---|---|---|---|
| 9,287,734 B2 * | 3/2016 | Wegelin | H02J 7/34 |
| 2011/0022025 A1 * | 1/2011 | Savoie | A61M 5/14248 604/500 |
| 2013/0175296 A1 * | 7/2013 | Gray | A47K 5/1207 222/135 |
| 2014/0232319 A1 * | 8/2014 | Wegelin | H02J 7/34 320/101 |
| 2016/0197258 A1 * | 7/2016 | Wegelin | H02J 7/34 320/101 |

* cited by examiner

*Primary Examiner* — Mohammed Alam
(74) *Attorney, Agent, or Firm* — Cooper Legal Group LLC

(57) ABSTRACT

Among other things, one or more systems and/or techniques for harvesting thermal energy for utilization by a dispensing system are provided herein. The dispensing system may comprise one or more thermal scavenging devices configured to collect thermal energy from a user. For example, a first thermal scavenging device, coupled to a top housing portion of the dispensing system, may collect thermal energy from a palm of a user hand; a second thermal scavenging device, coupled to a bottom housing portion of the dispensing system, may collect thermal energy from a top portion of the user hand; and/or other thermal scavenging devices may be operatively coupled to the dispensing system. In this way, the collected thermal energy is transformed into electrical energy for powering the dispensing system (e.g., powering a current dispense event, stored for a subsequent dispense event, validation of a refill container, detection of a user, etc.).

20 Claims, 9 Drawing Sheets

THERMAL ENERGY HARVESTING FOR DISPENSING SYSTEM

RELATED APPLICATIONS

This application claims priority to and is a continuation of U.S. application Ser. No. 15/069,201, filed on Mar. 14, 2016, presently titled "THERMAL ENERGY HARVESTING FOR DISPENSING SYSTEM", which claims priority to and is a divisional of U.S. application Ser. No. 13/770,440, filed on Feb. 19, 2013, presently titled "THERMAL ENERGY HARVESTING FOR DISPENSING SYSTEM", both of which are incorporated herein.

TECHNICAL FIELD

The instant application is generally directed towards dispensing systems for dispensing a material, such as a liquid, powder, aerosol, or other types of materials. For example, the instant application is directed to a dispensing system that utilizes thermal energy, harvested from a user, for powering the dispensing system.

BACKGROUND

Many locations, such as hospitals, factories, restaurants, homes, etc., utilize dispensing systems to dispense material. For example, a dispensing system may dispense a liquid material, powder material, aerosol material, and/or other materials (e.g., soap, anti-bacterial gels, cleansers, disinfectants, lotions, etc.). Some dispensing systems utilize a refill container for ease of maintenance, environmental concerns, etc. The refill container may, for example, comprise a pump and/or nozzle mechanism that can be used by a dispensing system to dispense material from the refill container.

A dispensing system may utilize a power source to perform various tasks, such as a detect user task, a validate refill container task, a dispense task, etc. In an example, a hands free dispensing system may utilize a battery as a power source. In another example, the hands free dispensing system may utilize a solar panel as a power source. Unfortunately, power sources used by a dispensing system may increase material and/or manufacturing costs of the dispensing system.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

Among other things, one or more systems and/or techniques for harvesting thermal energy for utilization by a dispensing system are provided herein. In some embodiments, a thermal scavenging structure is configured to collect thermal energy from a user, and transform the thermal energy into electrical energy for utilization by the dispensing system. It may be appreciated that the thermal energy may be collected from any portion of a user, such as a hand of the user or other part of the user. The thermal scavenging structure may comprise one or more thermal scavenging devices that are operably coupled to a housing of the dispensing system. In an example, the one or more thermal scavenging devices are oriented with respect to a material dispense zone (e.g., an area into which material is dispensed to a user through a dispenser nozzle) according to a thermal collection configuration.

In an example, a first thermal scavenging device may be mounted onto a front housing portion of the dispensing system, such that thermal energy is collected from a body of the user. In another example, a second thermal scavenging device may be mounted to an upper housing portion of the material dispense zone (e.g., a portion comprising the dispenser nozzle), such that thermal energy is collected from a palm of a user hand when placed into the material dispense zone. In another example, a third thermal scavenging device may be mounted to a bottom housing portion of the material dispense zone (e.g., a portion comprising a spill tray), such that thermal energy is collected from a top portion of the user hand when placed into the material dispense zone. In another example, a fourth thermal scavenging device may be mounted to a back housing portion of the material dispense zone, such that thermal energy is collected from a fingertip region of the user hand when placed into the material dispense zone. In another example, a fifth thermal scavenging device may be mounted to a first side housing portion of the material dispense zone, such that thermal energy is collected from a little finger side of the user hand when placed into the material dispense zone. In another example, a sixth thermal scavenging device may be mounted to a second side housing portion of the material dispense zone, such that thermal energy is collected from a thumb side of the user hand when placed into the material dispense zone. It may be appreciated that any number of thermal scavenging devices may be mounted and/or oriented in any manner to facilitate harvesting thermal energy.

In some embodiments, the thermal scavenging structure (e.g., and/or one or more thermal scavenging devices thereof) may utilize the thermal energy (e.g., before transformation into the electrical energy) to modify a shape of the dispenser nozzle (e.g., a nozzle comprised of a material that changes shape based upon heat) to facilitate flow of a material from the dispenser nozzle during a current dispense event. The dispenser nozzle may comprise a material (e.g., a memory material) that may substantially return to an original shape once the dispenser nozzle is no longer subjected to the thermal energy.

In some embodiments, a utilization device is configured to utilize the electrical energy, transformed from the thermal energy, for powering the dispensing system. It may be appreciated that the electrical energy may be utilized for various tasks, such as an energy storage task (e.g., storing energy into a battery or capacitor utilized to power the dispensing system), a refill container validation task, a dispense task, etc. In an example, the utilization device utilizes the electrical energy for a current dispense event, such that material is dispensed into a user hand (e.g., a user hand from which the thermal energy was collected). In another example, the utilization device stores the electrical energy within a battery, a capacitor, a super capacitor, and/or energy storage device that may provide power for a subsequent dispense event.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
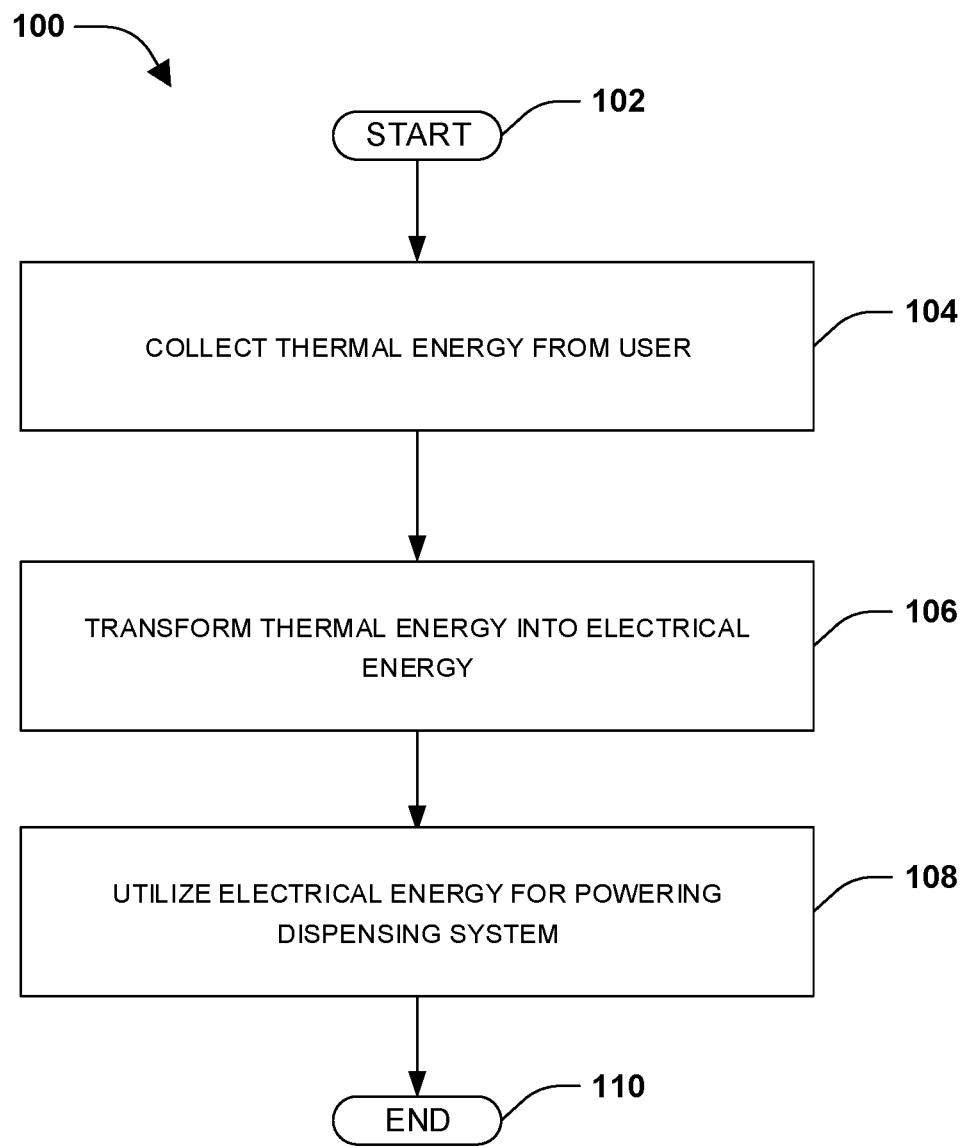
FIG. 1 is a flow diagram illustrating a method of harvesting thermal energy for utilization by a dispensing system, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

An embodiment for harvesting thermal energy for utilization by a dispensing system is illustrated by an exemplary method 100 of FIG. 1. At 102, the method starts. At 104, thermal energy (e.g., heat) is collected from a user. In some embodiments, thermal energy is collected by one or more thermal scavenging devices operatively coupled to (e.g., directly and/or indirectly) a housing of the dispensing system. The housing may define a material dispense zone comprising an area within which a material is dispensed to a user through a dispenser nozzle. In an example, the thermal energy is collected by a first thermal scavenging device operatively coupled to a top portion of the housing (e.g., an upper portion of the material dispense zone comprising the dispenser nozzle), and is configured to collect the thermal energy from a user, such as from a palm of a user hand. In another example, second thermal energy is collected by a second thermal scavenging device operatively coupled to a bottom portion of the housing (e.g., a portion comprising a spill tray). In this way, one or more thermal scavenging devices (e.g., a third thermal scavenging device coupled to a first side housing portion, a fourth thermal scavenging device coupled to a second side housing portion, a fifth thermal scavenging device coupled to a back housing portion, a sixth thermal scavenging device coupled to a front housing portion, etc.) are configured to collect thermal energy from the user for utilization by the dispensing system. For example, the thermal energy may be utilized for a power storage task, a dispense task, a refill container validation task, etc.

In some embodiments, the thermal energy is used to facilitate modification of a shape of the dispenser nozzle, such that the modified shape allows the dispenser nozzle to dispense material during a current dispense event. After the thermal energy is no longer applied to the dispenser nozzle (e.g., the user removes the user hand from the material dispense zone after the current dispense event), the dispenser nozzle may substantially return to an original shape, such that the dispenser nozzle restricts the flow of the material from the dispenser nozzle (e.g., the dispenser nozzle may comprise a memory material capable of returning to an original shape).

At 106, the thermal energy (e.g., heat transferred from the user to a first material of a thermal scavenging device, such that a temperature of the first material is increased based upon the heat) is transformed into electrical energy (e.g., a current or voltage created based upon the first material, having the increased temperature, transferring heat to a second material, such that a temperature of the second material is increased based upon the transferred heat). For example, the thermal scavenging device, such as a thermoelectric generator (e.g., utilizing a bimetallic junction, a semiconductor p-n junction, or any type of thermoelectric generator), may operate based upon a Seebeck Effect to generate the electrical energy due to the temperature difference between the first material and the second material (e.g., the thermal energy collected from the user increases the temperature of the first material to a temperature that is greater than a temperature of the second material). In some embodiments, a chemical aspect is comprised within the transformation of the thermal energy into electrical energy.

At 108, the electrical energy is utilized for powering the dispensing system. In some embodiments, the electrical energy is utilized for a current dispense event. In an example, the current dispense event may be powered merely by the electrical energy (e.g., the dispensing system may not rely upon a battery). In another example, the current dispense event may be powered by a combination of the electrical energy and energy provided from another source (e.g., energy from a battery or electrical energy stored from previously harvested thermal energy). In another example, the electrical energy is stored for a subsequent dispense event (e.g., stored within a battery, a capacitor, a super capacitor, or other storage device). In another example, the electrical energy is utilized for other tasks, such as validation of a refill container or detection of a user. For example, rather than dispensing material, the electrical energy may be used to detect the presence of a user, which may justify a dispense event, and/or enable activation of another sensor to verify the presence of a user, etc. In some embodiments, an amount of electrical energy stored is between about 0.01 Joules to about 10.0 Joules. In some embodiments, the stored electrical energy may be from multiple harvesting, collecting, scavenging, etc. events. As will be appreciated, thermal energy can be collected (e.g., by multiple thermal scavenging devices, larger thermal scavenging devices, etc.) from multiple areas around a user (e.g., the user hand) to facilitate collecting a greater amount of thermal energy and thus generating a greater amount of electrical energy than would otherwise be obtained with fewer or smaller thermal scavenging devices. At 110, the method ends.

Figure 2:
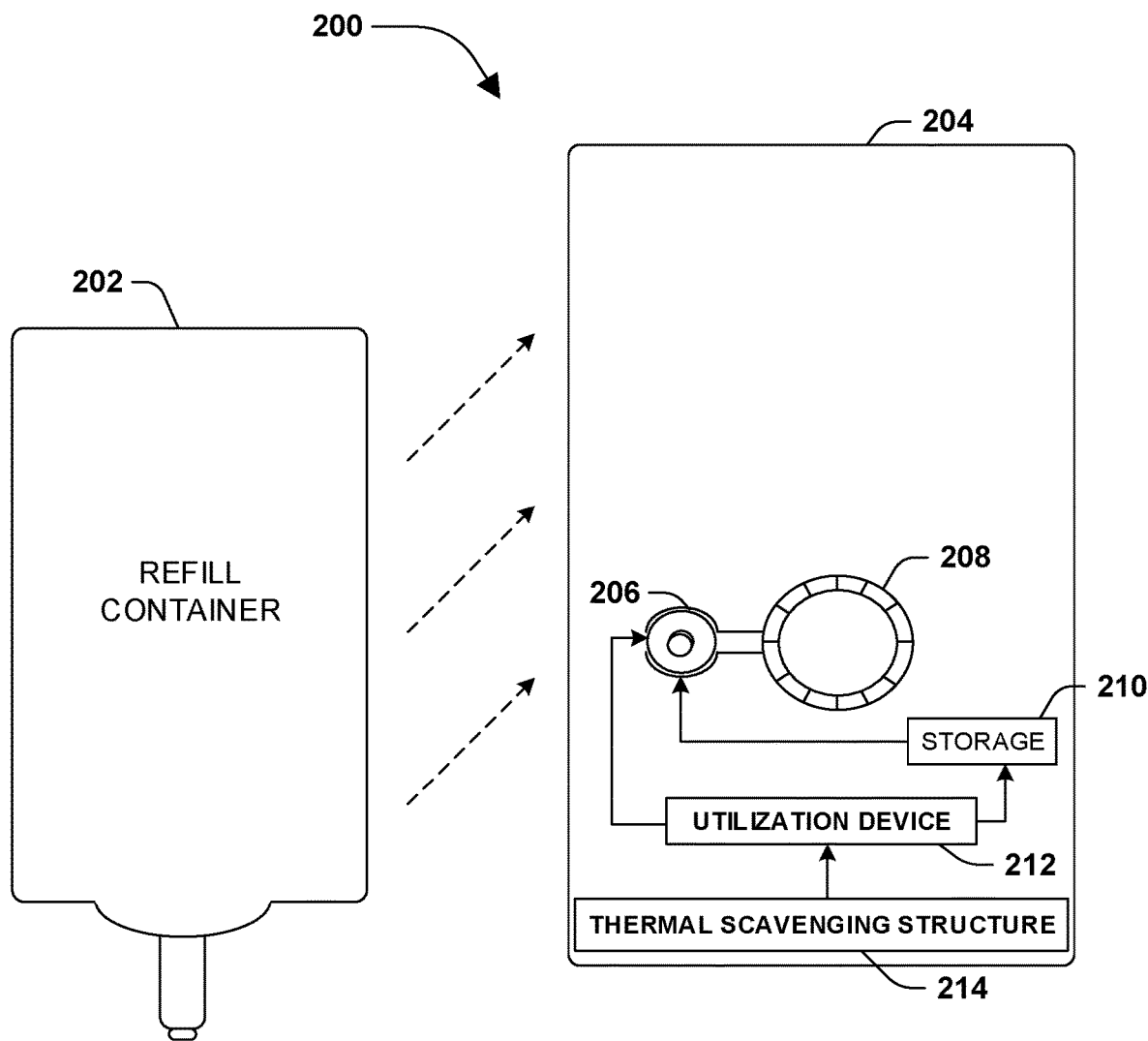
FIG. 2 is a component block diagram illustrating a dispensing system for dispensing a material utilizing harvested thermal energy, according to some embodiments.

FIG. 2 illustrates an example of a dispensing system 200 for dispensing a material utilizing harvested thermal energy. The dispensing system 200 may comprise a housing 204 configured to hold a refill container 202 comprising material (e.g., a liquid material, a powder material, an aerosol material, an antibacterial product, etc.). The housing 204 may define a material dispense zone comprising an area within which a material is dispensed from the refill container 202 by the dispensing system during a dispense event. The housing 204 may comprise various mechanical and/or electrical components that facilitate operation of the dispensing system 200, such as one or more components that dispense material from the refill container 202. For example, the housing 204 may comprise a motor 206 and a gear train 208 used to dispense material from the refill container 202 during a dispense event (e.g., a user may place a hand under an optical actuator to initiate the dispense event). During a dispense event, the motor 206, the gear train 208, and/or other components (e.g., a dispenser nozzle of the refill container 202) may dispense material from the refill container 202, where any one or more of which may be powered, at least in part, by thermal energy harvested from a user.

The dispensing system 200 may comprise a thermal scavenging structure 214. The thermal scavenging structure 214 may comprise one or more thermal scavenging devices oriented relative to the material dispense zone according to a thermal collection configuration (e.g., FIGS. 5-7). Respective thermal scavenging devices may be configured to collect thermal energy from a user, and transform the thermal energy into electrical energy. The dispensing system 200 may comprise a utilization device 212 configured to utilize the electrical energy for powering the dispensing system 200 (e.g., energy storage task, a dispense task, a refill container validation task, etc.). In an example, the utilization device 212 may be configured to store the electrical energy within a storage device 210 for a subsequent dispense event. In another example, the utilization device 212 may be configured to utilize the electrical energy for a current dispense event, such as by powering the motor 206 using the electrical energy.

Figure 3:
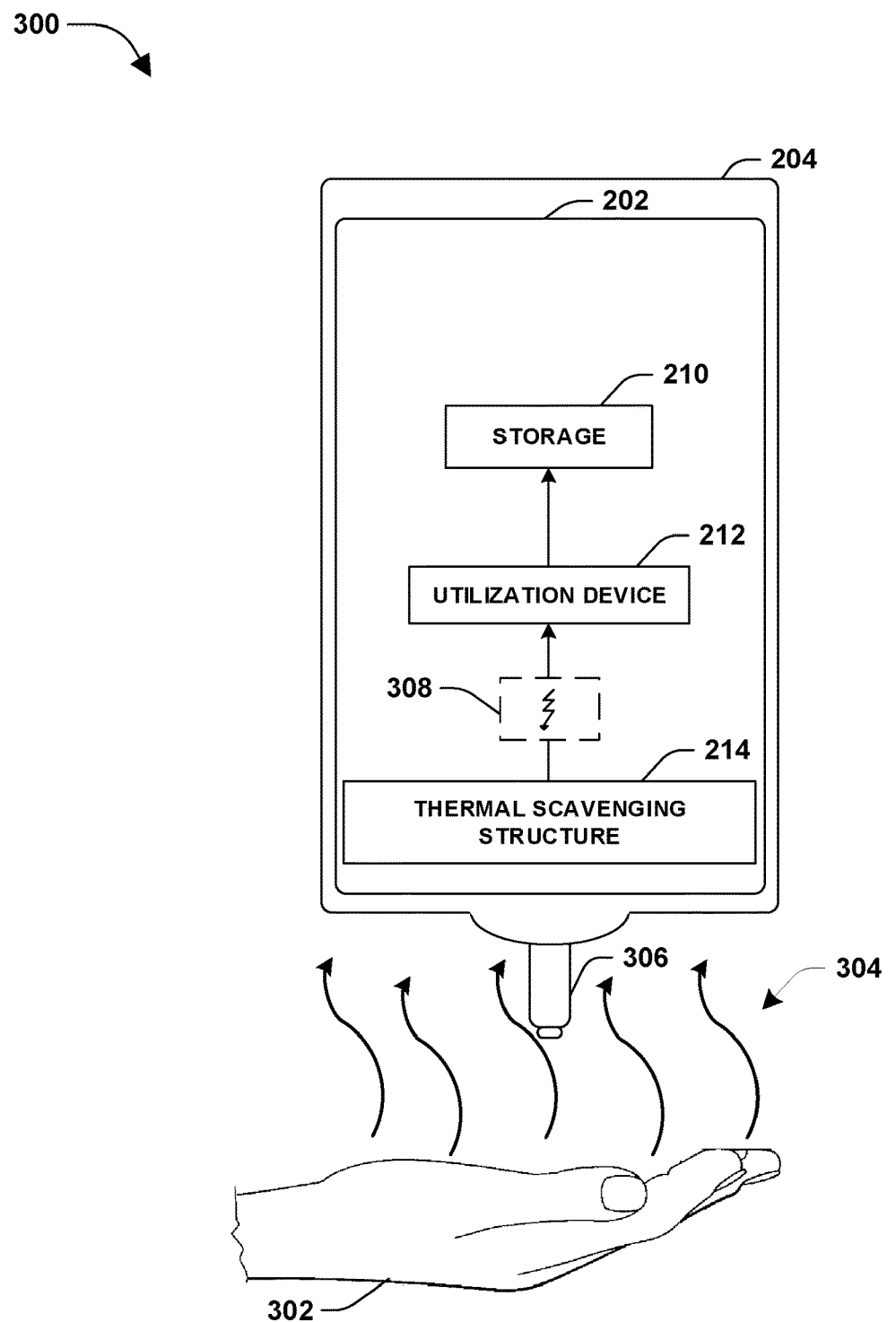
FIG. 3 is a component block diagram illustrating a dispensing system for storing electrical energy transformed from thermal energy collected from a user, according to some embodiments.

FIG. 3 illustrates an example of a dispensing system 300 for storing electrical energy 308 transformed from thermal energy 304 collected from a user. The dispensing system 300 may comprise a housing 204 within which a refill container 202, comprising material that can be dispensed by the dispensing system 300, may be installed. The dispensing system 300 may comprise a thermal scavenging structure 214 configured to harvest thermal energy from a user for use in powering the dispensing system 300. In an example, the thermal scavenging structure 214 may comprise a first thermal scavenging device operably coupled to a lower portion of the housing 204 that comprises a dispenser nozzle 306 configured to dispense material from the refill container 202. The first thermal scavenging device may be configured to collect thermal energy 304 from a user, such as a user hand 302. The first thermal scavenging device may transform the thermal energy 304 into electrical energy 308.

The dispensing system 300 may comprise a utilization device 212 configured to utilize the electrical energy 308 for powering the dispensing system 300. In an example, the utilization device 212 may store the electrical energy 308 within a storage device 210, such as a battery, capacitor, super capacitor, or other types of storage device. In this way, the stored electrical energy 308 may be used to perform a subsequent task (e.g., a subsequent dispense task, a refill container validation task, etc.). In some embodiments, the dispensing system 300 may be hands free and/or battery free, thus relying merely upon electrical energy generated from thermal energy of a user. In some embodiments, the dispensing system 300 may be hands free but not battery free, such that the electrical energy is used to supplement and/or replenish a power supply, such as a battery (e.g., the storage device 210), of the dispensing system 300.

Figure 4A:
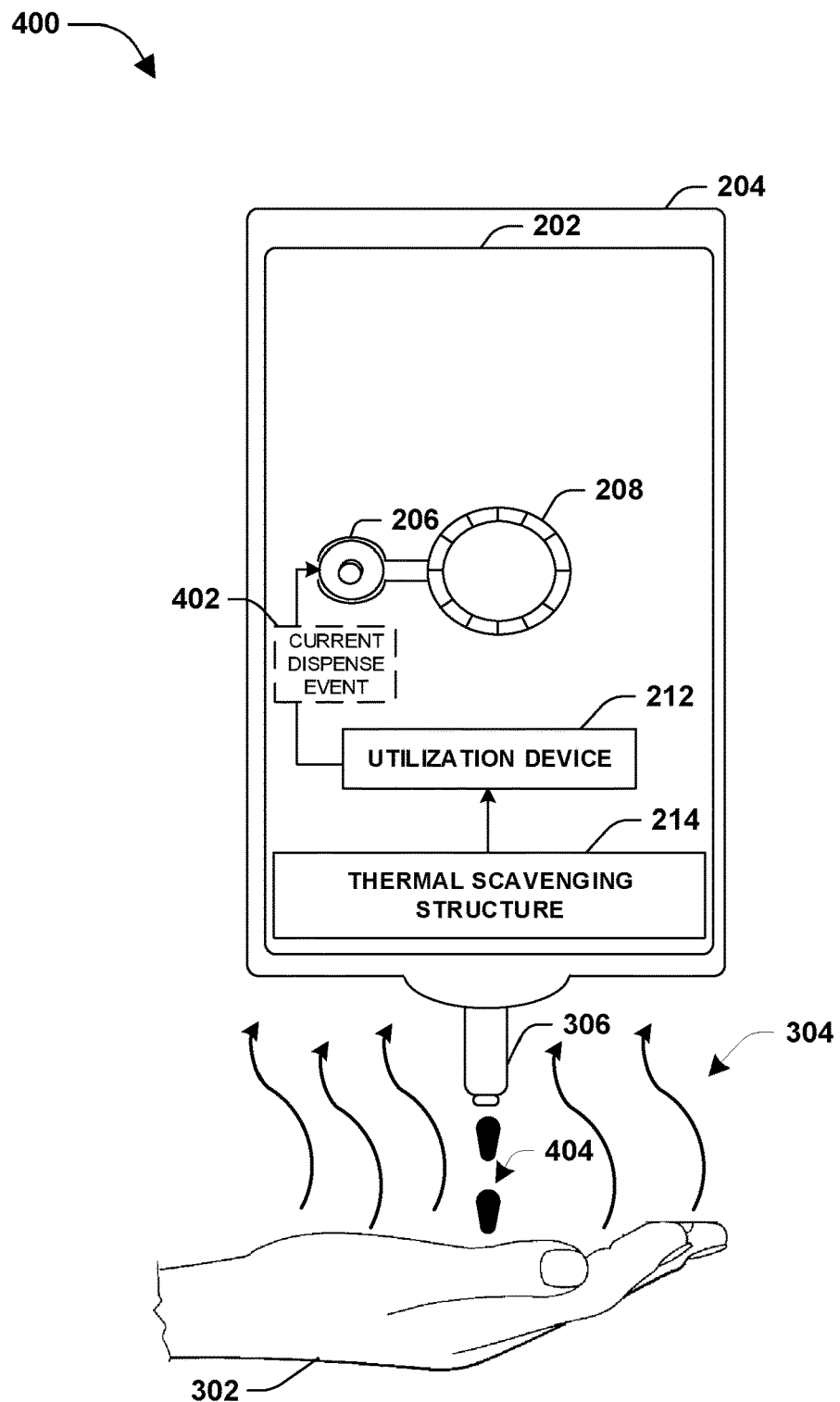
FIG. 4A is a component block diagram illustrating a dispensing system for utilizing electrical energy, transformed from thermal energy collected from a user, to power a current dispense event, according to some embodiments.

FIG. 4A illustrates an example of a dispensing system 400 for utilizing electrical energy transformed from thermal energy 304 collected from a user to power a current dispense event 402. The dispensing system 400 may comprise a housing 204 within which a refill container 202, comprising material that can be dispensed by the dispensing system 400, may be installed. The dispensing system 400 may comprise a thermal scavenging structure 214 configured to harvest thermal energy from a user for use in powering the dispensing system 400. The thermal scavenging structure 214 may comprise a first thermal scavenging device operably coupled to a lower portion of the housing 204 that comprises a dispenser nozzle 306 configured to dispense material from the refill container 202. The first thermal scavenging device may be configured to collect thermal energy 304 from a user, such as a user hand 302. The first thermal scavenging device may transform the thermal energy 304 into electrical energy.

The dispensing system 400 may comprise a utilization device 212 configured to utilize the electrical energy for powering the dispensing system 400. In an example, the utilization device 212 utilizes the electrical energy for the current dispense event 402. For example, the electrical energy is used (e.g., alone or in combination with additional electrical energy from another source) to power a motor 206, a gear train 208, and or other components configures to dispense material 404 from the dispenser nozzle 306 into the user hand 302. In some embodiments, the dispensing system 400 may be hands free and/or battery free, thus relying merely upon electrical energy generated from thermal energy of a user. In some embodiments, the dispensing system 400 may be hands free but not battery free, such that the electrical energy is used to supplement and/or replenish a power supply, such as a battery, of the dispensing system 400.

Figure 4B:
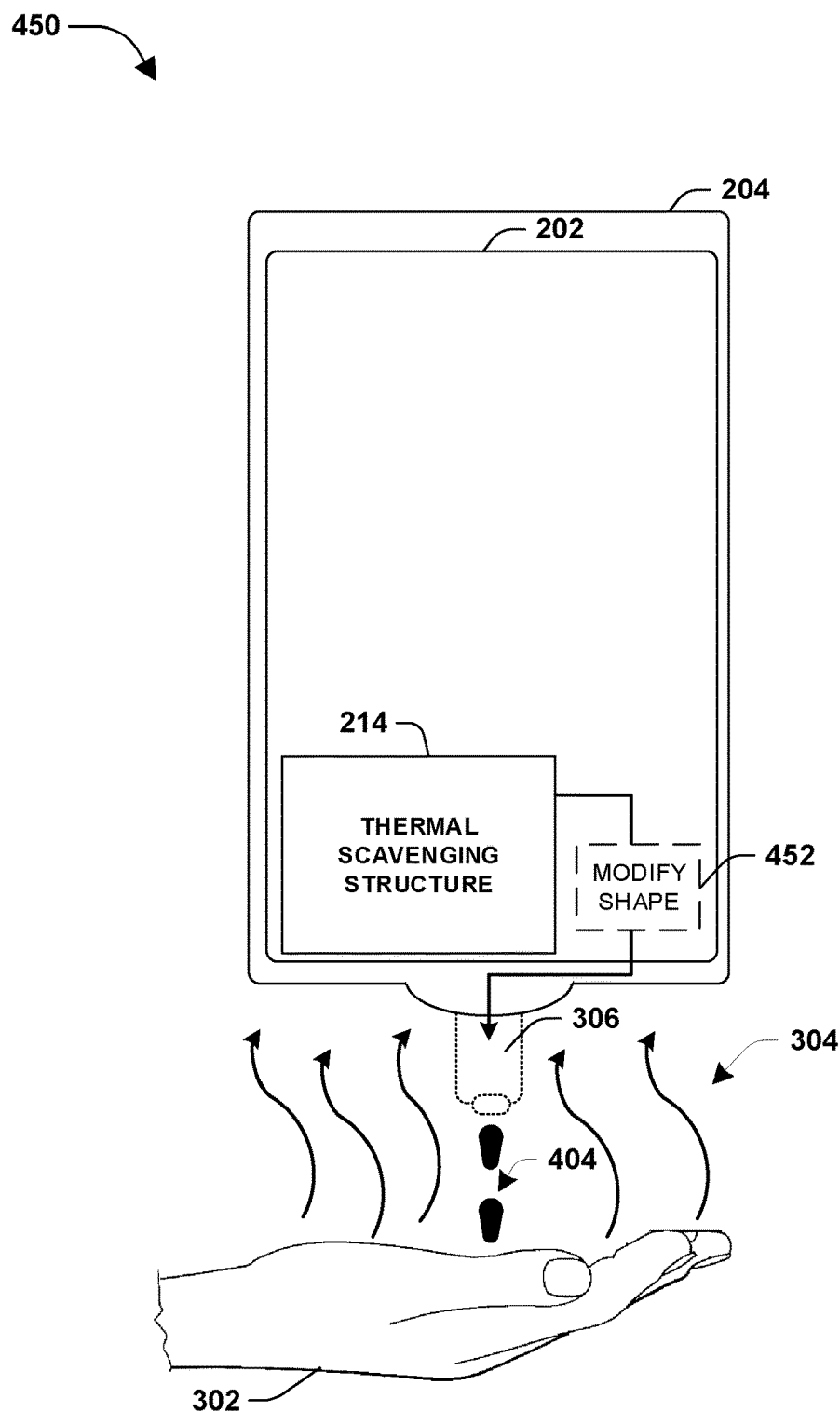
FIG. 4B is a component block diagram illustrating a dispensing system for facilitating a current dispense event based upon thermal energy collected from a user, according to some embodiments.

FIG. 4B illustrates an example of a dispensing system 450 for facilitating a current dispense event based upon thermal energy 304 collected from a user. The dispensing system 450 may comprise a housing 204 within which a refill container 202, comprising material that can be dispensed by the dispensing system 450, may be installed. The dispensing system 450 may comprise a thermal scavenging structure 214 configured to harvest thermal energy from a user, such as a user hand 302, to facilitate a current dispense event. In an example, the thermal scavenging structure 214, such as a first thermal scavenging device of the thermal scavenging structure 214, may be configured to modify 452 a shape of a dispenser nozzle 306, such that material 404 is dispensed through the dispenser nozzle 306 based upon the modified shape (e.g., an outlet of the dispenser nozzle 306 may expand to a diameter that allows the material 404 to flow through the outlet). In an example, the dispenser nozzle 306 is comprised of a memory material, such that the dispense nozzle 306 substantially returns to an original shape after the current dispense event (e.g., once the dispenser nozzle 306 is not subjected to the thermal energy, such as when the user hand 302 is removed from a material dispense zone). In some embodiments, the dispenser nozzle 306 is configured to facilitate the current dispense event without functionality provided by the thermal scavenging structure 214 (e.g., the shape of the dispenser nozzle 306 is modified based upon the thermal energy from the user hand 302 without having the thermal scavenging structure 214 process the thermal energy).

Figure 5:
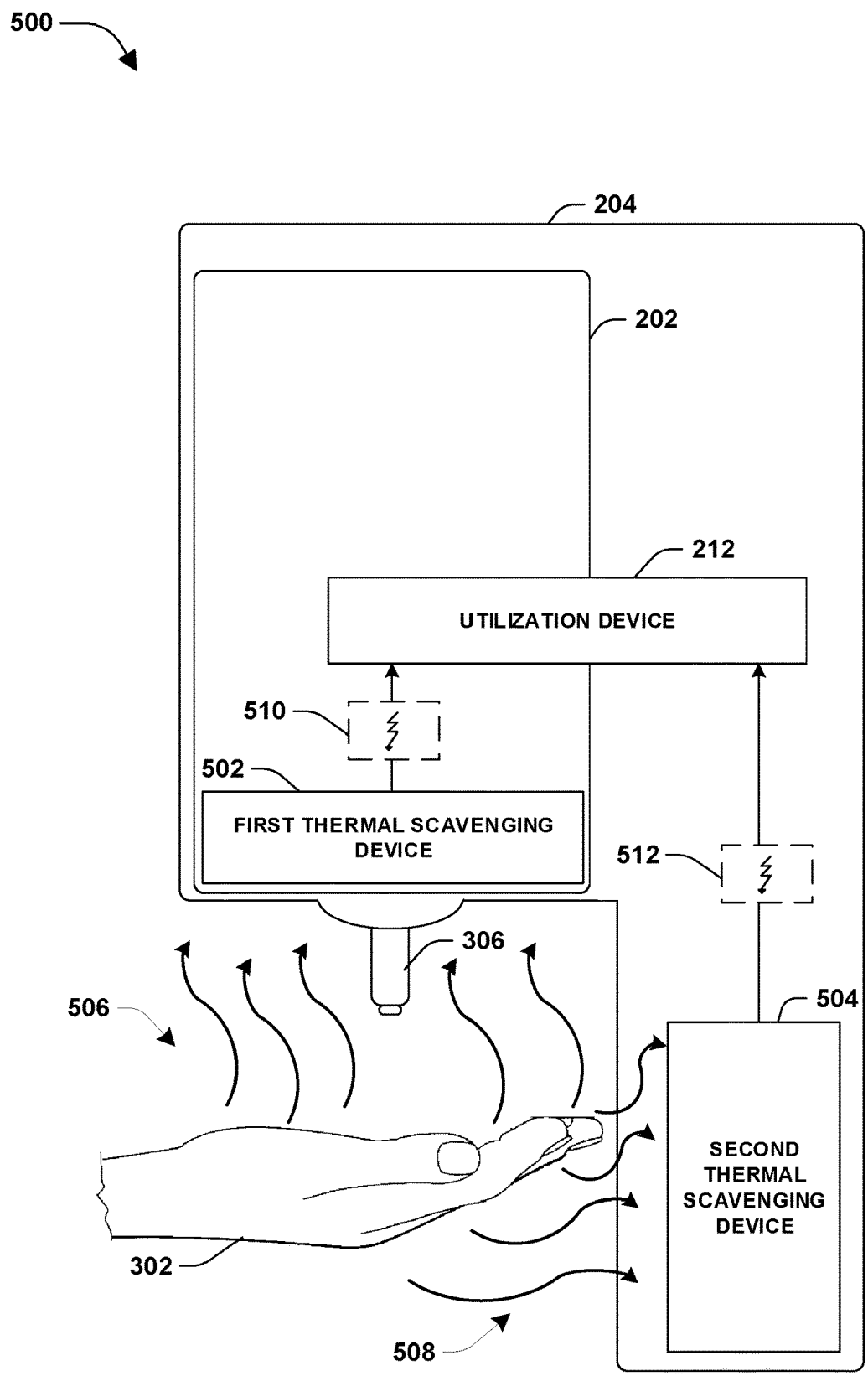
FIG. 5 is a component block diagram illustrating a system for harvesting thermal energy for utilization by a dispensing system, according to some embodiments.

FIG. 5 illustrates an example of a system 500 for harvesting thermal energy for utilization by a dispensing system. The system 500 comprises a first thermal scavenging device 502, a second thermal scavenging device 504, and/or a utilization device 212. The first thermal scavenging device 502 may be operably coupled to an upper portion of a housing 204 of the dispensing system (e.g., an upper portion of the housing 204 comprising a dispenser nozzle 306). The second thermal scavenging device 504 may be operably coupled to a back portion of the housing 204. The upper portion and the back portion of the housing 204 may define a material dispense zone of the dispensing system. The material dispense zone may comprise an area within which a material is dispensed from a refill container 202 to a user by the dispensing system.

The first thermal scavenging device 502 may be configured to collect thermal energy 506 from a user, such as from a palm of a user hand 302. The first thermal scavenging device 502 may transform the thermal energy 506 into electrical energy 510. The second thermal scavenging device 504 may be configured to collect second thermal energy 508 from the user, such as from fingertips of the user hand 302. The second thermal scavenging device 504 may transform the second thermal energy 508 into second electrical energy 512. It may be appreciated that any number of thermal scavenging device may be utilized for harvesting thermal energy, and may be oriented with respect to the dispensing system according to any configuration.

The utilization device 212 may be configured to utilize the electrical energy 510 and/or the second electrical energy 512 for powering the dispensing system. In an example, the utilization device 212 may store the electrical energy 510 and/or the second electrical energy 512 within a storage device. In another example, the utilization device 212 may utilize the electrical energy 510 and/or the second electrical energy 512 for a current dispense event In some embodiments, if less than all of the electrical energy 510 and/or the second electrical energy 512 are used for the current dispense event, then the remaining electrical energy may be stored within the storage device. In some embodiments, if the electrical energy 510 and the second electrical energy 512 are not sufficient to power the current dispense event, then additional power may be used from another power source such as a battery (e.g., charged from previously harvested thermal energy).

Figure 6:
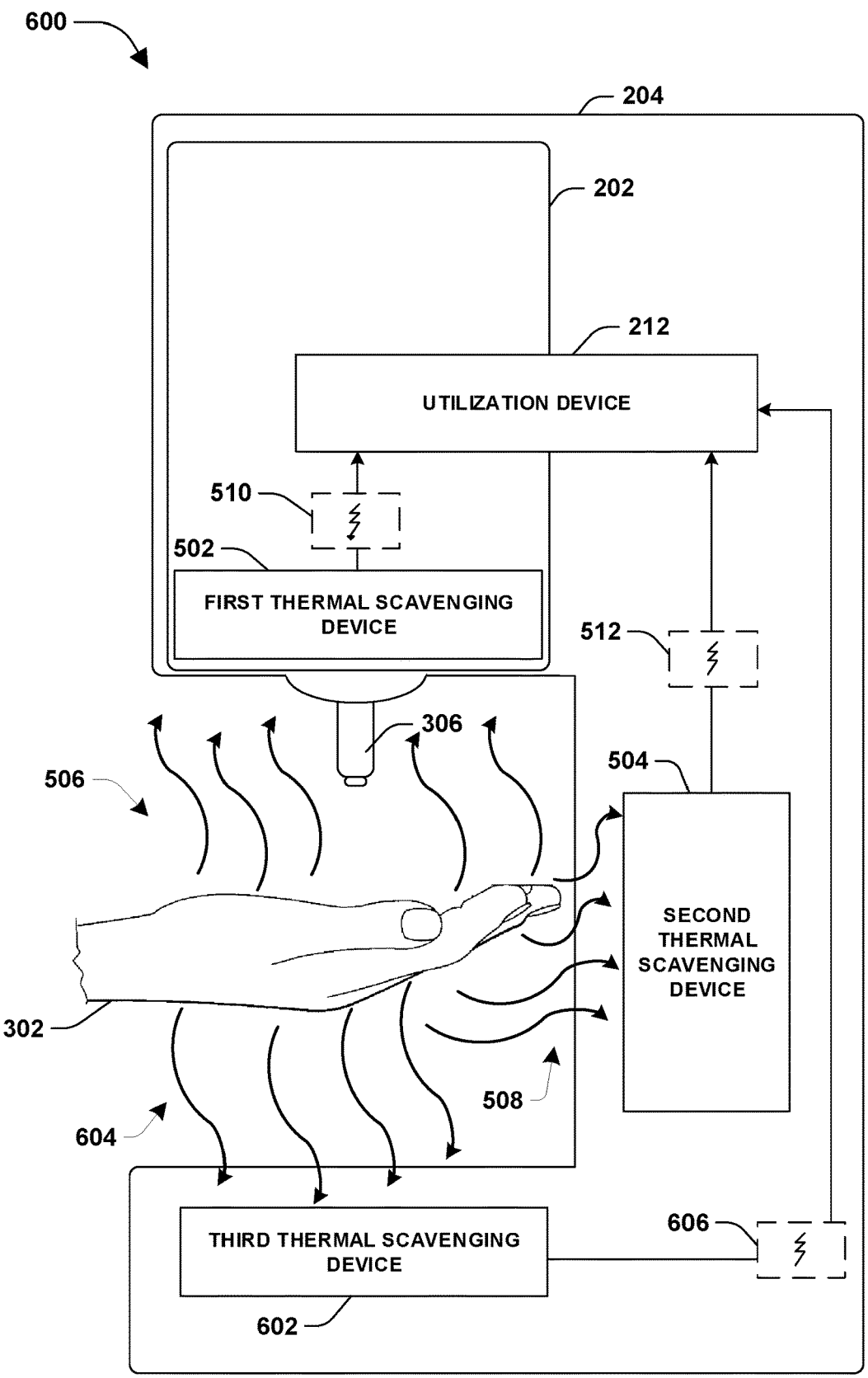
FIG. 6 is a component block diagram illustrating a system for harvesting thermal energy for utilization by a dispensing system, according to some embodiments.

FIG. 6 illustrates an example of a system 600 for harvesting thermal energy for utilization by a dispensing system. The system 600 comprises a first thermal scavenging device 502, a second thermal scavenging device 504, a third thermal scavenging device 602, and/or a utilization device 212. The first thermal scavenging device 502 may be operably coupled to an upper portion of a housing 204 of the dispensing system (e.g., an upper portion of the housing 204 comprising a dispenser nozzle 306). The second thermal scavenging device 504 may be operably coupled to a back portion of the housing 204. The third thermal scavenging device 602 may be operably coupled to a lower portion of the housing 204 of the dispensing system (e.g., a spill tray of the dispensing system). The upper portion, the back portion, and the lower portion of the housing 204 may define a material dispense zone of the dispensing system. The material dispense zone may comprise an area within which a material is dispensed from a refill container 202 to a user by the dispensing system.

The first thermal scavenging device 502 may be configured to collect thermal energy 506 from a user, such as a palm of a user hand 302. The first thermal scavenging device 502 may transform the thermal energy 506 into electrical energy 510. The second thermal scavenging device 504 may be configured to collect second thermal energy 508 from the user, such as fingertips of the user hand 302. The second thermal scavenging device 504 may transform the second thermal energy 508 into second electrical energy 512. The third thermal scavenging device 602 may be configured to collect third thermal energy 604 from the user, such as a top side of the user hand 302. The third thermal scavenging device 602 may transform the third thermal energy 604 into third electrical energy 606. It may be appreciated that any number of thermal scavenging device may be utilized for harvesting thermal energy, and may be oriented with respect to the dispensing system according to any configuration.

The utilization device 212 may be configured to utilize the electrical energy 510, the second electrical energy 512, and/or the third electrical energy 606 for powering the dispensing system. In an example, the utilization device 212 may store the electrical energy 510, the second electrical energy 512, and/or the third electrical energy 606 within a storage device. In another example, the utilization device 212 may utilize the electrical energy 510, the second electrical energy 512, and/or the third electrical energy 606 for a current dispense event. In some embodiments, if less than all of the electrical energy 510, the second electrical energy 512, and/or the third electrical energy 606 are used for the current dispense event, then the remaining electrical energy may be stored within the storage device. In some embodiments, if the electrical energy 510, the second electrical energy 512, and the third electrical energy 606 are not sufficient to power the current dispense event, then additional power may be used from another power source such as a battery (e.g., charged from previously harvested thermal energy).

Figure 7:
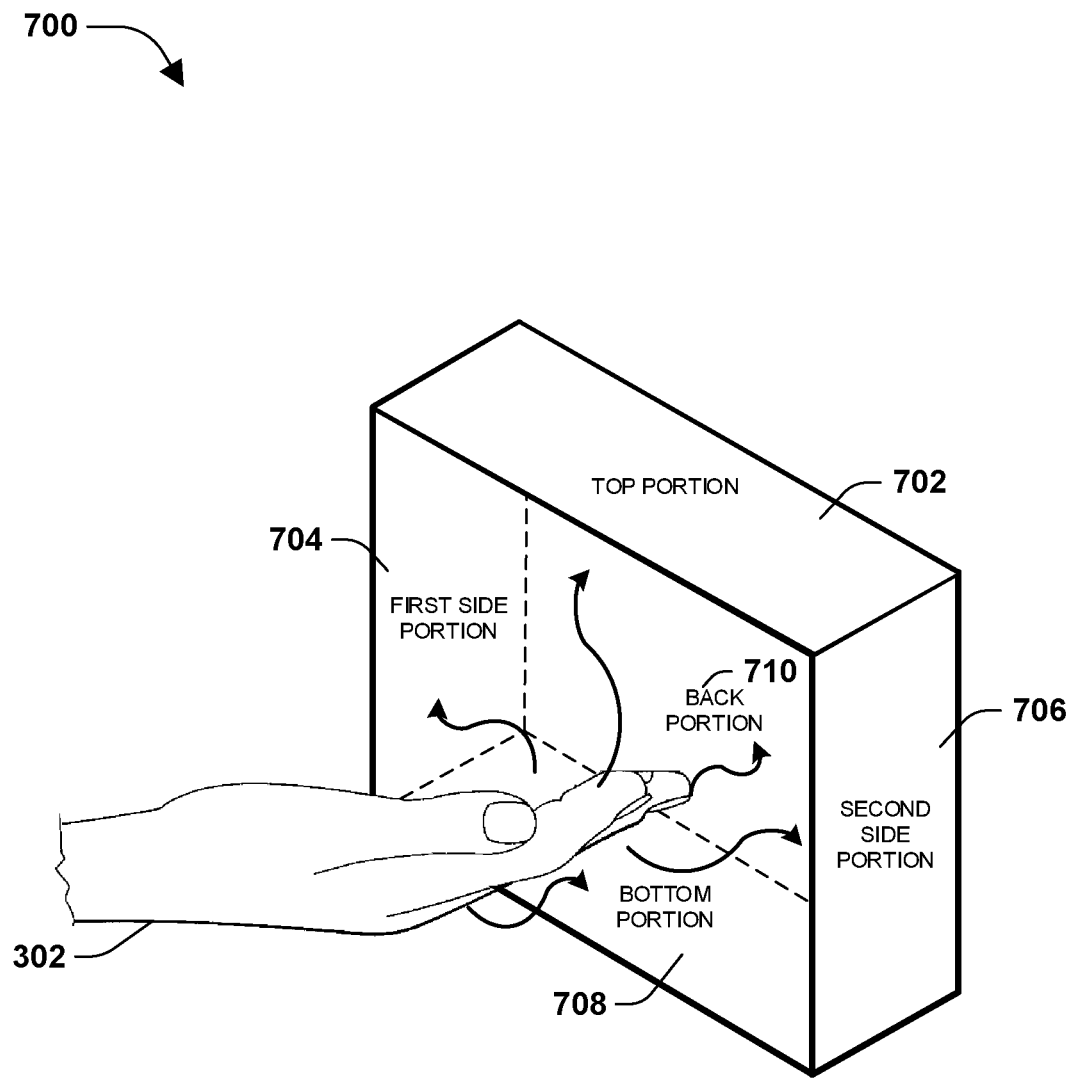
FIG. 7 is an illustration of a thermal collection configuration used to orient one or more thermal scavenging devices with respect to a dispensing system, according to some embodiments.

FIG. 7 illustrates an example 700 of a thermal collection configuration used to orient one or more thermal scavenging devices with respect to a dispensing system. That is, the thermal collection configuration may define one or more thermal collection zones within which thermal scavenging devices may be placed and/or oriented. In an example, a first thermal collection zone may be associated with a top portion 702 of a housing of the dispensing system (e.g., a portion of the housing comprising a dispenser nozzle). The housing may define a material dispense zone comprising an area within which a material is dispensed to a user, such as a user hand 302, by the dispensing system. A first thermal scavenging device may be oriented according to the first thermal collection zone (e.g., the first thermal scavenging device may collect thermal energy from a palm of the user hand). A second thermal collection zone may be associated with a bottom portion 708 of the housing (e.g., a portion of the housing comprising a spill tray). A second thermal scavenging device may be oriented according to the second thermal collection zone (e.g., the second thermal scavenging device may collect thermal energy from a top portion of the user hand 302).

A third thermal collection zone may be associated with a first side portion 704 of the housing. A third thermal scavenging device may be oriented according to the third thermal collection zone (e.g., the third thermal scavenging device may collect thermal energy from a little finger side of the user hand 302). A fourth thermal collection zone may be associated with a second side portion 706 of the housing. A fourth thermal scavenging device may be oriented according to the fourth thermal collection zone (e.g., the fourth thermal scavenging device may collect thermal energy from a thumb side of the user hand 302). A fifth thermal collection zone may be associated with a back portion 710 of the housing. A fifth thermal scavenging device may be oriented according to the fifth thermal collection zone (e.g., the fifth thermal scavenging device may collect thermal energy from fingertips of the user hand 302).

Figure 8:
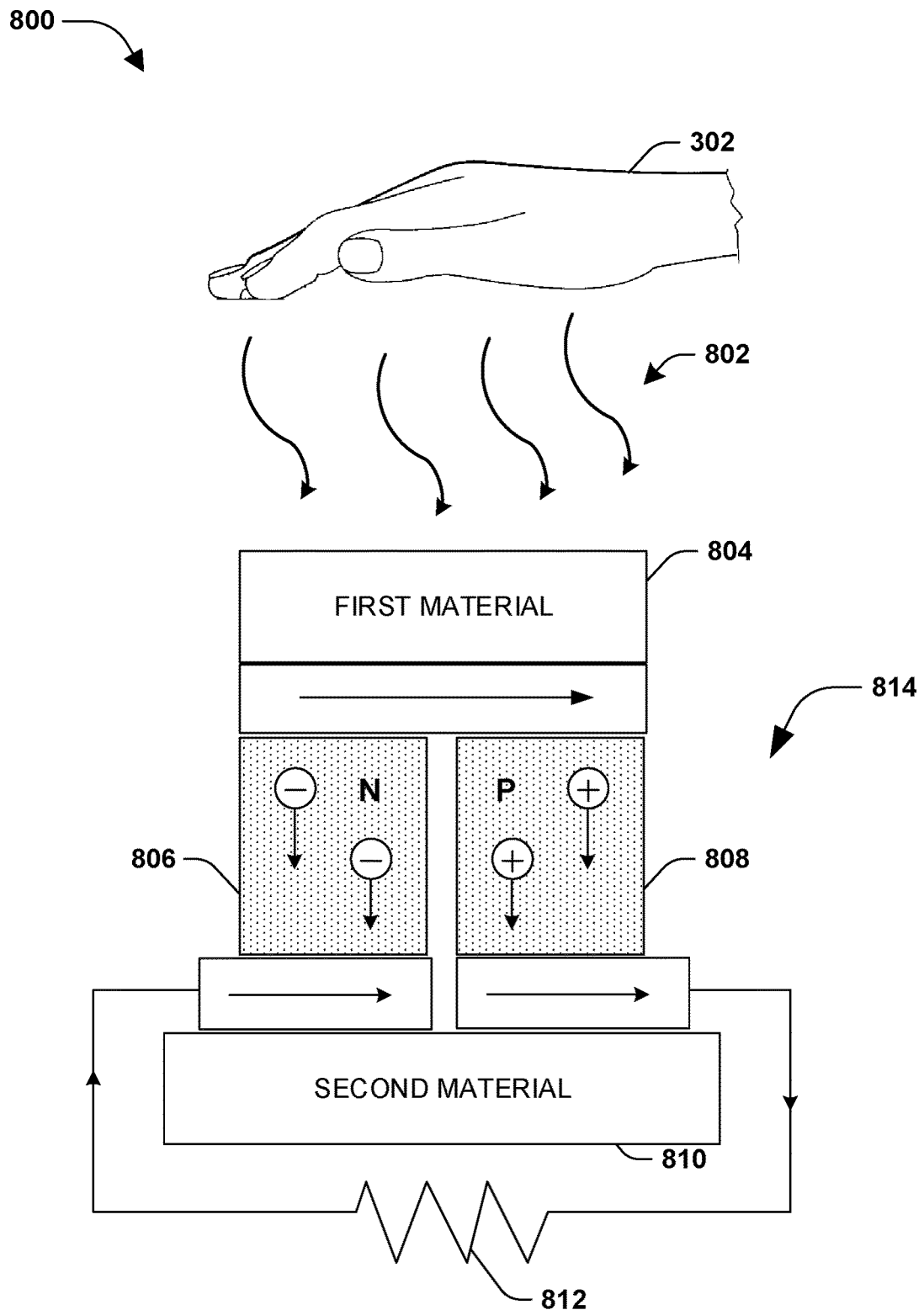
FIG. 8 is an illustration of a thermal scavenging device, according to some embodiments.

FIG. 8 illustrates an example 800 of a thermal scavenging device 814. The thermal scavenging device 814 may comprise a first material 804 (e.g., a first metallic connector) that is connected by one or more semiconductor elements (e.g., an n-type element 806 and/or a p-type element 808) to a second material 810 (e.g., a second metallic connector). A temperature of the first material 804 may increase based upon thermal energy 802 from a user, such as a hand 302. For example, the temperature of the first material 804 may increase relative to a temperature of the second material, resulting in a temperature difference between the first material 804 (e.g., having a relatively higher temperature) and the second material 810 (e.g., having a relatively lower temperature). Charge-carrier diffusion may result based upon the temperature difference between the first material 804 and the second material 810. In particular, hot carriers from the first material 804 may diffuse towards the second material 810 because the second material 810 has a relatively lower density of hot carriers due to the relatively lower temperature of the second material 810 in relation to the first material 804. Similarly, cold carriers may diffuse from the second material 810 to the first material 804. Electrical energy, such as an electric current, is created based upon the diffusion of the carriers. For example, the thermal energy 802 may drive electrons in the n-type element 806 towards the second material 810, thus resulting in a current through a circuit 812. Holes within the p-type element 808 flow in the direction of the current. In this way, the thermal energy is transformed into electrical energy, which can be stored or used without being stored.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

Many modifications may be made to the instant disclosure without departing from the scope or spirit of the claimed subject matter. Unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A system for harvesting thermal energy for utilization by a dispensing system, comprising:
   a thermal scavenging device configured to:
      collect thermal energy from a portion of a human user responsive to the portion of the human user entering a material dispense zone at a first time; and
      transform the thermal energy into electrical energy; and
   a utilization device configured to:
      utilize the electrical energy to cause the dispensing system to dispense material into the material dispense zone, wherein the portion of the human user is removed from the material dispense zone at a second time after the first time.

2. The system of claim 1, wherein the collecting the thermal energy is performed while the portion of the human user is a distance away from the dispensing system.

3. The system of claim 1, wherein the thermal scavenging device is configured to collect second thermal energy and transform the second thermal energy into second electrical energy, and the utilization device is configured to store the second electrical energy.

4. The system of claim 3, wherein the utilization device is configured to store the second electrical energy within at least one of a battery, a capacitor or a super capacitor.

5. The system of claim 1, wherein the utilization device is configured to:
   modify a dispenser nozzle from a first shape to a second shape based upon the portion of the human user entering the material dispense zone at the first time; and
   modify the dispenser nozzle from the second shape to the first shape based upon the portion of the human user being removed from the material dispense zone at the second time.

6. The system of claim 1, wherein the dispensing system is configured to dispense at least one of a liquid material, a powder material or an aerosol material.

7. The system of claim 1, wherein the dispensing system is configured to dispense at least one of a soap, an antibacterial gel, a cleanser, a disinfectant or a lotion.

8. A method for initiating a dispense event of a dispensing system, comprising:
   collecting, via a thermal scavenging device of the dispensing system, thermal energy from a portion of a human user responsive to the portion of the human user entering a material dispense zone at a first time; and
   initiating the dispense event of the dispensing system by transforming the thermal energy, comprising transferred heat, into electrical energy and using the electrical energy to cause the dispensing system to dispense material, wherein the portion of the human user is removed from the material dispense zone at a second time after the first time.

9. The method of claim 8, wherein the collecting the thermal energy is performed while the portion of the human user is a distance away from the dispensing system.

10. The method of claim 8, comprising:
    collecting, via the thermal scavenging device, second thermal energy;
    transforming the second thermal energy into second electrical energy; and
    storing the second electrical energy.

11. The method of claim 10, wherein the storing comprises storing the second electrical energy within at least one of a battery, a capacitor or a super capacitor.

12. The method of claim 8, comprising:
collecting, via the thermal scavenging device, second thermal energy;
transforming the second thermal energy into second electrical energy; and
modifying a shape of a dispenser nozzle based upon the second electrical energy.

13. The method of claim 8, wherein the dispensing system is configured to dispense at least one of a liquid material, a powder material, an aerosol material, a soap, an anti-bacterial gel, a cleanser, a disinfectant or a lotion.

14. A system for harvesting thermal energy for utilization by a dispensing system, comprising:
a thermal scavenging device configured to:
collect thermal energy from a portion of a human user responsive to the portion of the human user entering a material dispense zone at a first time; and
transform the thermal energy into electrical energy; and
a utilization device configured to:
utilize the electrical energy to cause the dispensing system to perform one or more tasks, wherein the portion of the human user is removed from the material dispense zone at a second time after the first time.

15. The system of claim 14, wherein the collecting the thermal energy is performed while the portion of the human user is a distance away from the dispensing system.

16. The system of claim 14, wherein the thermal scavenging device is configured to collect second thermal energy and transform the second thermal energy into second electrical energy, and the utilization device is configured to store the second electrical energy.

17. The system of claim 16, wherein the utilization device is configured to store the second electrical energy within at least one of a battery, a capacitor or a super capacitor.

18. The system of claim 14, wherein the thermal scavenging device is configured to collect second thermal energy and transform the second thermal energy into second electrical energy, and the utilization device is configured to modify a shape of a dispenser nozzle based upon the second electrical energy.

19. The system of claim 14, wherein the one or more tasks comprise at least one of a detect user task or a validate refill container task.

20. The system of claim 14, wherein the dispensing system is configured to dispense at least one of a soap, an anti-bacterial gel, a cleanser, a disinfectant or a lotion.

* * * * *